United States Patent [19]

Chu

[11] Patent Number: 5,330,615

[45] Date of Patent: Jul. 19, 1994

[54] SYMMETRIC DOUBLE WATER PLASMA ETCHING SYSTEM

[76] Inventor: Cheng Chu, 5373 Bothe Ave., San Diego, Calif. 92122

[21] Appl. No.: 787,076

[22] Filed: Nov. 4, 1991

[51] Int. Cl.⁵ .......................................... H01L 21/00
[52] U.S. Cl. .................................. 156/643; 156/646; 204/192.32
[58] Field of Search .................. 156/646, 643, 345; 118/723; 204/298.34, 192.32

[56] References Cited

U.S. PATENT DOCUMENTS

| | | | |
|---|---|---|---|
| 4,622,094 | 11/1986 | Otsubo | 156/643 X |
| 4,626,312 | 12/1986 | Tracy | 156/345 |
| 4,863,549 | 9/1989 | Grünwald | 156/643 X |
| 4,871,421 | 10/1989 | Ogle et al. | 156/643 |
| 5,057,185 | 10/1991 | Thomas, III et al. | 156/643 |
| 5,061,359 | 10/1991 | Babu et al. | 156/643 X |
| 5,147,493 | 9/1992 | Nishimura et al. | 156/345 |

FOREIGN PATENT DOCUMENTS

| | | | |
|---|---|---|---|
| 221620 | 9/1988 | Japan | 156/345 |
| 35914 | 2/1989 | Japan | 156/345 |
| 39530 | 2/1990 | Japan | 156/345 |
| 130826 | 5/1990 | Japan | 156/345 |
| 173124 | 7/1991 | Japan | 156/345 |

Primary Examiner—Thi Dang
Attorney, Agent, or Firm—Bo-In Lin

[57] ABSTRACT

The present invention teaches a method to produce and construct a symmetric double wafer parallel plate RF plasma etching system. In such a symmetric system, maximum voltage difference between the electrodes and minimum voltage differences between the individual electrodes and reactor vessel are easily achieved. Two wafers can be etched in a single discharge and efficiency may be increased considerably when compared with single wafer systems.

1 Claim, 2 Drawing Sheets

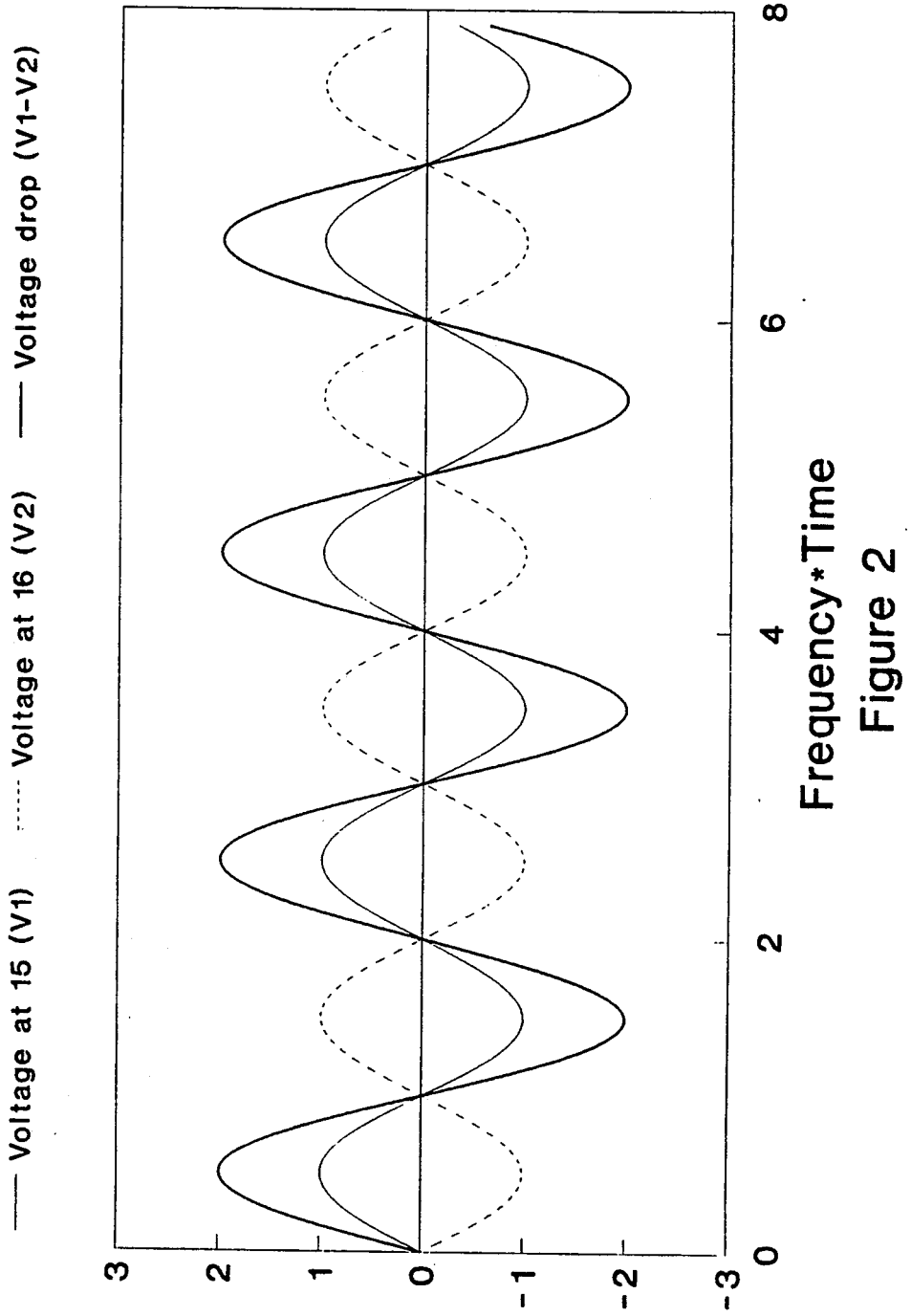

SYMMETRIC DOUBLE WATER PLASMA ETCHING SYSTEM

BACKGROUND OF THE INVENTION

1. Field of the Invention

This invention relates generally to the apparatus and process used in plasma-based etching. More specifically, this invention teaches an apparatus and a process to perform plasma etching by using a double wafer parallel plate RF plasma etching system.

2. Description of the Prior Art

Parallel plate plasma etching used in integrate circuit (IC) manufacture is limited by several difficulties including the problems of stray electrical discharges, the low etching efficiency, and the asymmetry and nonuniformity in plasma currents during etching. Since the ability to develop and build ever so smaller microelectronic devices depends strongly on the capability to generate a desired device pattern in an image layer by lithography and then transfer this pattern into the layers of materials by etching process, improvement to plasma etching performance is critically important. Parallel plate plasma etching system which is commonly used in dry etching process offers higher accuracy in replicating device patterns than the wet etching processes.

A parallel plate plasma etching system generally has a reactor chamber containing a pair of electrodes to which RF power is applied. A wafer including a film thereon to be etched is then placed on one of the electrodes. The electrode whereon the wafer is placed is commonly referred to as a chuck electrode whereas the opposite electrode without a wafer is termed as a counter electrode. Suitable gases are injected into the chamber and plasma is formed to etch the film. High or low radio frequencies are used in the etching process dependent upon the type of film being etched. Such a system is called a single wafer parallel plate plasma etching system.

In order to enhance the etch rate, it is desirable to induce a high voltage across the electrodes, imparting high energy levels to the system. One undesirable consequence of applying high voltage across the electrodes is the resulting excessive stray electrical discharges from the electrodes to the reactor chamber wall and other parts in the system. In order to circumvent this problem, several designs are proposed to minimize the potential difference between either electrode and the reactor chamber wall while maintaining a high voltage difference between the two electrodes.

U.S. Pat. No. 4,626,312 to Tracy entitled "Plasma Etching System for Minimizing Stray Electrical Discharges" Dec. 2, 1986), proposes that stray electrical discharges may be reduced by dividing the applied voltage between the chuck and counter electrodes while maintaining the etching chamber at a ground potential. Because of the asymmetries in the construction of the reactor vessel, electrodes, and electrical feed lines, as well as the unbalanced impedance load placed on the counter electrode by the wafer, a precise division of the voltage can not be fully effected and the theoretical maximum voltage can not be realized.

U.S. Pat. No. 4,871,421 to Ogle and Yin entitled "Split Phase Driver for Plasma Etch System" (Oct. 3, 1989) utilizes an elaborated split-phase driver to deal with the problem of intrinsic electrical asymmetry of single wafer system in order to achieve a precise 180 degree phase difference and therefore the maximum voltage difference between the two electrodes.

Even that a single wafer etching system as proposed by Ogle et al. is able to generate a greater electrode voltage difference, it is still limited by the unresolved problems of low etching efficiency and the asymmetrical etching performance which is inherent in its wafer placement on a single electrode. Additionally, during the half cycle of the RF voltage when the chuck electrode having a voltage higher than that at counter electrode, current flows from chuck electrode to counter electrode. Energetic ions bombard the counter electrode instead of the wafer disposed on chuck electrode. Consequently, not only that power is wasted, damage of counter electrode occurs while the electrode is bombarded by ions without the shielding of a wafer.

SUMMARY OF THE PRESENT INVENTION

Accordingly, one object of the present invention is to provide a complete symmetrical parallel plate plasma etching system whereby differential voltage between the electrodes may be maximized and the stray discharges between the electrodes and the etching chamber may be minimized without the use of a complicate phase splitting circuitry.

It is another object of the present invention to provide an etching configuration to double the etching efficiency by eliminating the unnecessary waste of the half cycle of RF power in the etching process.

It is a further object of this invention to teach a plasma etching configuration to prolong the useful life of the electrodes by eliminating the direct ion bombardment onto the surface of a counter electrode during the half RF cycle when the chuck electrode is at a higher potential than the counter electrode.

It is a further object of this invention to teach a plasma etching system with improved etching performance by providing a symmetric double wafer etching system whereby minimizing the asymmetric plasma current.

The present invention provides a method and apparatus for a symmetric double wafer RF plasma etching system. Identical wafer having a film to be etched is disposed on each of the electrodes to make electrical properties symmetric about the central plane between the two parallel plates. Due to the symmetry in this double wafer plasma etching system, the maximum voltage difference between the parallel, opposed electrodes and minimum potential difference between either electrode and reactor chamber wall is much more easily achieved than that in asymmetric single wafer plasma etching systems. A radio frequency voltage is applied across the electrodes. Means are provided to split the voltage so that substantially equal voltages but with phase difference of 180 degrees are applied to the two electrodes. Because of the electrical symmetry of this double wafer system, there is no need to use an elaborated split-phase driver as proposed by Ogle et al. The reactor chamber wall may be grounded electrically. In this way, maximum etching power can be provided while reducing or eliminating arcing and stray discharges. Energetic ions bombard mainly the wafer on the electrode at lower voltage. As the RF voltage waveform varies in time, wafers on the two electrodes take turns to be bombarded. Two wafers can be etched in a single discharge and efficiency of the system may be improved considerably compared with a single wafer system. In addition, the wafer on electrode may reduce the damage suffered by counter electrode in single wafer systems and therefore may increase the mean operation time between cleans.

Other objects and advantages of the present invention will be apparent and suggest themselves to those skilled in the art, from a reading of the following specification and claims, taken in conjunction with the accompany drawings.

BRIEF DESCRIPTION OF THE DRAWINGS

FIG. 2 is RF voltage waveform shown for the purposes of explanation of the embodiments illustrated in FIG. 1. Etching of each wafer takes place when voltage becomes negative at the electrode it resides.

DESCRIPTION OF THE PREFERRED EMBODIMENT

Figure 1:
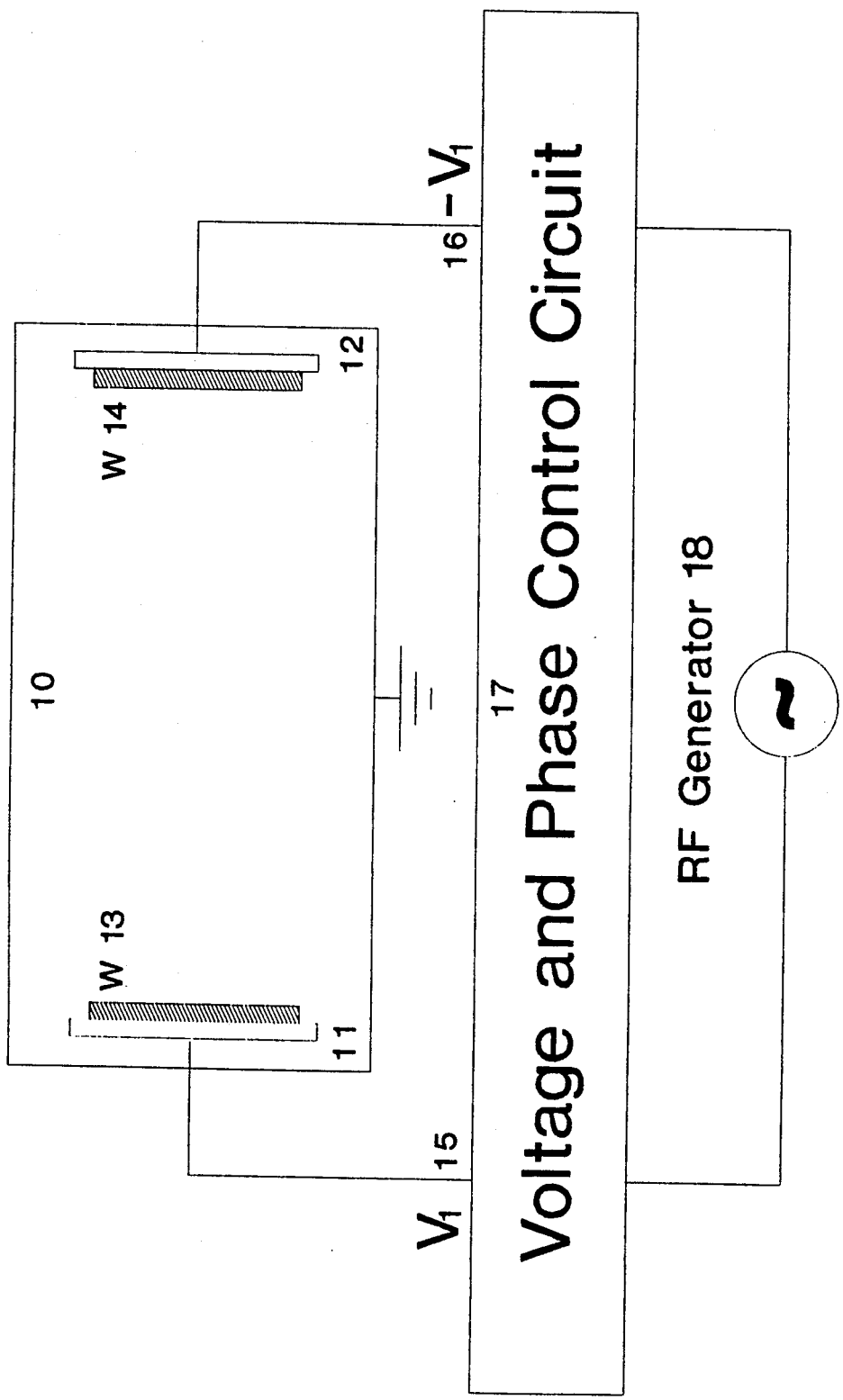
FIG. 1 is a schematic illustration of an embodiments of the present invention.

Referring to FIG. 1, an RF plasma etching system comprises a plasma etching chamber 10. The walls of the chamber may be grounded or maintained at some reference potential. Electrodes 11 and 12 are isolated from the walls of the chamber and electrically connected to terminals 15 and 15, respectively. Wafers 13 and 14 with appropriate film are positioned on electrodes 11 and 12, respectively. Power from a RF generator 18 via control circuit 17 is delivered to terminals 15 and 16. The control circuit 17 may be designed to provide equal-magnitude, oppositely phased voltages at terminal 15 and 16. A typical waveform is shown in FIG. 2. The voltage at terminal 16 is equal to the voltage at terminal 15 with a minus sign. Suitable gases may be injected into the chamber 10 and ionized by the RF power. When the voltage at terminal 15 is of negative value, etching takes place mainly on wafer 13. In the other half-cycle, when voltage at terminal 15 goes positive, wafer 14 becomes the main etching place. Both wafers 13 and 14 may be etched in a single discharge and efficiency may be increased considerably compared with single wafer system. In addition, impurities resulting from bombardment of ions on conventional counter electrode 12 in single wafer system may be reduced because of the shielding provided by wafer 14 in this embodiment.

The details relating to components for cooling, vacuum pumping, control circuit, and other elements of an etching system are readily available through conventional means and are well known by those skilled in the art. They are not illustrated or described in detail for purpose of clarity.

While the invention has been shown and described with reference to the embodiment above, it will be understood by those skilled in the art that various changes in forms and details may be made therein without departing from the essence, scope, and teaching of the invention. For example, any type of control circuit may be used, such as inductive, capacitive, resistive or some combinations. Symmetric arrangement of multiple wafers on electrodes may also be feasible. A wide spectrum of RF power may be used. A variety of methods may be used to hold wafer on the electrode. Accordingly, the invention disclosed herein is to be limited only as specified in the following claims.

I claim:

1. A method for symmetrically plasma etching two semiconductor wafers comprising the steps of:
   symmetrically placing two wafers on two planar electrodes in an etching chamber maintaining at a chamber reference voltage;
   injecting an etching gas into said etching chamber; and
   applying an RF voltage to said two electrodes to provide to said two electrodes two corresponding symmetrical 180 degree out-of-phase voltages of substantially equal magnitude relative to said chamber reference voltage whereby said etching gas is ionized and said etching method produce a minimal stray electrical discharge.

* * * * *